US009729205B2

United States Patent
Pietri et al.

(10) Patent No.: US 9,729,205 B2
(45) Date of Patent: Aug. 8, 2017

(54) BATTERY MANAGEMENT SCHEME FOR NFC

(71) Applicant: Optis Circuit Technology, LLC, Plano, TX (US)

(72) Inventors: Pierre-Jean Pietri, Annecy-le-Vieux (FR); Bruno Delplanque, Chaville (FR)

(73) Assignee: Optis Circuit Technology, LLC, Plano, TX (US)

( * ) Notice: Subject to any disclaimer, the term of this patent is extended or adjusted under 35 U.S.C. 154(b) by 404 days.

(21) Appl. No.: 14/374,611

(22) PCT Filed: Feb. 12, 2013

(86) PCT No.: PCT/EP2013/052738
§ 371 (c)(1),
(2) Date: Jul. 25, 2014

(87) PCT Pub. No.: WO2013/120826
PCT Pub. Date: Aug. 22, 2013

(65) Prior Publication Data
US 2015/0035386 A1    Feb. 5, 2015

Related U.S. Application Data

(60) Provisional application No. 61/606,523, filed on Mar. 5, 2012.

(30) Foreign Application Priority Data

Feb. 15, 2012   (EP) .................................... 12305167

(51) Int. Cl.
*H04B 5/00*   (2006.01)
*H04M 1/725*   (2006.01)
(Continued)

(52) U.S. Cl.
CPC ....... *H04B 5/0037* (2013.01); *G01R 31/3606* (2013.01); *H04B 5/0031* (2013.01);
(Continued)

(58) Field of Classification Search
CPC .......................... H04B 5/0037; H04B 5/0031; G01R 31/3606; H04M 1/7253; H04M 2250/04; H04W 52/0261; Y10T 307/858
(Continued)

(56) References Cited

U.S. PATENT DOCUMENTS

2009/0150704 A1   6/2009   Van Bosch
2009/0291634 A1   11/2009  Saarisalo

OTHER PUBLICATIONS

International Search Report issued in corresponding International application No. PCT/EP2013/052738, date of mailing Mar. 7, 2013.
(Continued)

*Primary Examiner* — Hal Kaplan
(74) *Attorney, Agent, or Firm* — Spencer C. Patterson; Grable Martin Fulton PLLC

(57) ABSTRACT

There is described a method for establishing an NFC connection between a subscriber identity module (SIM) and an NFC device (RDR). The subscriber identity module (SIM) is connected to a telecommunications system (CELL_P) through contacts (VCC, RST, CLK, D+, GND, SWP, IO, D−) of the telecommunications system (CELL_P). The telecommunications system (CELL_P) comprises a chipset (CHP) and an NFC circuit (NFCC). The method comprises measuring the level of charge of a battery (BATT) powering the telecommunications system (CELL_P) with a battery gauge. Based on the measurement, the method selects the source for supplying power to the subscriber identity module (SIM) and configures the wiring of the subscriber identity module (SIM). The disclosure also relates, in particular, to a telecommunications system, to a computer program, and to a storage medium.

18 Claims, 4 Drawing Sheets

(51) Int. Cl.
H04W 52/02 (2009.01)
G01R 31/36 (2006.01)
(52) U.S. Cl.
CPC ..... *H04M 1/7253* (2013.01); *H04W 52/0261* (2013.01); *H04M 2250/04* (2013.01); *Y02B 60/50* (2013.01); *Y10T 307/858* (2015.04)
(58) Field of Classification Search
USPC ........................................................ 307/130
See application file for complete search history.

(56) References Cited

OTHER PUBLICATIONS

Extended European Search Report issued in corresponding European application No. EP 12 30 5167, date of completion Jun. 26, 2012.
Written Opinion of the International Searching Authority issued in corresponding International application No. PCT/EP2013/052738, date of mailing Mar. 7, 2013.
ETSI; "Smart Cards; UICC—Contacless Front-end (CLF) Interface; Part 1: Physical and data link layer characteristics (Release 7)"; ETSI TS 102 613 V7.0.0 (Nov. 2007) Technical Specification; Nov. 2007; pp. 1-56.

BATTERY MANAGEMENT SCHEME FOR NFC

BACKGROUND

Technical Field

The invention generally relates to devices and methods for battery management in the context of Near Field Communication (NFC) telecommunications systems.

Related Art

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

Telecommunications systems (such as cell phones, smart phones, tablets, etc.) often integrate NFC capabilities. An NFC circuit embedded in a cell phone can be used, for example, as a tag reader in order to read external NFC tags, or to emulate a card device.

Card emulation has many applications. Two well-known use cases relate to micro-payment and e-ticketing.

Micro-payment may consist in purchasing items with a cell phone. For example, one may buy very low cost items (e.g. bread) by tapping the cell phone to an NFC reader (e.g. at a bakery), without even having to type a PIN code. The cell phone may subject the transaction to a check of the transaction amount, which should be below a certain threshold in order for the PIN code not to be necessary.

E-ticketing may consist in using a cell phone rather than a conventional NFC ticket in order to enter public transportation.

Both use cases require a high-level of security. It would not be acceptable to let hackers create money or steal money from third parties' cell phones. To this end, NFC support is often associated with a subscriber identity module within the cell phone that is commonly a SIM card. Interactions between the NFC circuit of a cell phone and a SIM card typically occur over a Single Wire Protocol (SWP) interface.

A problem with initial implementations of NFC support in telecommunications systems lies in the fact that when the system is switched off or whenever the battery level is too low, NFC support is no longer available.

Therefore, with initially implemented technologies, users were not able, for example, to enter public transportation or pay with their cell phone when the cell phone was switched off.

In order to overcome this problem, it has been proposed to power the SIM card through the NFC circuit when the battery is low or the cell phone is switched off.

An NFC reader (such as an NFC interface of a Point of Sales terminal, a.k.a POS, at a bakery), with which the user wishes to interact, may actively generate a radio frequency field that can power a passive target. The passive target may be a SIM card connected to an antenna embedded in a cell phone. Accordingly, the SIM card is available irrespective of whether the cell phone in which it is embedded is itself switched on.

However card emulation support requires a special wiring for the SIM card (as it may be alternately powered by the telecommunications system and by the NFC field).

In platform OFF state (i.e. when the telecommunications system is OFF), ETSI standards require that the VCC contact on the SIM card be maintained pulled down.

A first solution proposed to solve the SIM wiring issue is based on an external switch. As shown on FIG. 1, such solution comprises a module called DUAL P-Channel which acts as a switch and enables card emulation support in both platform ON and OFF modes.

In platform ON mode, the SIM card is directly supplied from the chipset (more specifically from the modem embedded in the chipset).

In platform OFF mode, the VSIM contact of the cell phone (corresponding to the VCC contact of the SIM card, i.e. the contact through which power is supplied to the SIM) is maintained pulled down by the modem. Whenever a card emulation transaction is started, the NFC circuit configures the DUAL P-Channel in such a way that the link between the SIM card and the modem is broken, allowing the NFC circuit to supply power to the SIM card directly and securely.

However this first solution is not optimal. This solution requires an external component (the switch "DUAL P-Channel") between the chipset and the NFC circuit. This external component avoids that current from the NFC circuit leak back to the chipset through the VCC/VSIM contact when the SIM card is powered by the NFC circuit. However this external component may introduce voltage drop on the VSIM contact, and that is sometimes an issue. Indeed, other contacts of the SIM card (such as the IO contact) are directly connected to the chipset and are not affected by such voltage drop, thereby introducing differences between voltage levels on the VCC contact and other contacts of the SIM card. This may be an issue for SIM cards certifications which require consistent voltage on all contacts of the SIM card.

A second solution proposed to solve the wiring issue is based on a simulated OFF mode. In this solution, whenever a cell phone is supposed to enter a power OFF mode due to user action or due to low battery, it enters a simulated power OFF mode (a.k.a fake power off), in which the cell phone seems to be OFF (the screen may be OFF, the modem may be OFF, etc), however the chipset is still ON with limited capabilities (modem is OFF, connectivity is OFF, etc). Very few features are available, primarily those necessary to maintain the SIM card supplied.

In fake power off, the SIM card is always supplied. In this solution, the SIM card cannot be supplied on demand due to micro-payment latency constraints (a micro-payment transaction typically takes a fraction of a second). Instead, in known fake power off implementations, the SIM card is first powered up. Then it negotiates connection parameters (such as supply voltage level and connection speed in bits/s) with the cell phone based on ATR (Answer To Reset, specified in ISO 7816). It then initializes itself, and finally is placed in "clock stop" stop mode (the CLK contact of the SIM card no longer receives a clock signal from the cell phone). Once in clock stop, the SIM card may ensure that its power consumption is below a certain threshold (various standards define a consumption threshold, but often in clock stop mode only). The SIM card may resume operations instantly, simply by receiving a clock signal from the cell phone. The latency constraints of this second solution (preventing on demand power up of the SIM card) come (inter alia) from the fact that in this solution, the NFC circuit has to request the chipset to start its SIM card controller, and this task is time consuming.

A problem with this second solution is that it allows maintaining card emulation for a limited time only. If the battery is almost empty and is no longer able to power the SIM card, despite being in fake power off, then NFC transactions are no longer possible. Ultimately, the fake power off is replaced by a real power off at the latest when the battery is empty.

This second solution typically provides a few extra hours of autonomy when a battery is low, but anything below 24 hours is typically not satisfactory for end users. In addition, this second solution requires very complex software. When the cell phone is switched off (either manually or due to a low battery event), it shut downs its operating system, and reboots the operating system in fake power off mode. This requires state machines and complex management software at operating system level (with two configurations of the operating system).

Therefore it is proposed to seek to improve the situation.

SUMMARY

To address these needs, an aspect of the invention relates to a method for establishing an NFC connection between a subscriber identity module and an NFC device, the subscriber identity module being connected to a telecommunications system through contacts of the telecommunications system, the telecommunications system comprising a chipset and an NFC circuit. The method comprises:

/a/ measuring the level of charge of a battery powering the telecommunications system with a battery gauge,
/b/ if the measured level is greater than a threshold,
/b1/ powering the subscriber identity module through a first connection between a power supply contact of the telecommunications system and the chipset,
/b2/ upon detection of an NFC device by the NFC circuit, establishing a connection between the subscriber identity module and the NFC device through the NFC circuit and a communications contact of the telecommunications system,
/c/ if the measured level is lower than or equal to the threshold,
/c1/ applying a pull down on the first connection from the chipset and then configuring the first connection, from the chipset, in high impedance mode,
/c2/ upon detection of an NFC device by the NFC circuit, powering the subscriber identity module from the NFC circuit through a second connection between said power supply contact and the NFC circuit, and establishing a connection between the subscriber identity module and the NFC device through the NFC circuit and said communications contact.

This method is advantageous, in particular in that it allows the telecommunications system to carry out NFC transactions (e.g. in card emulation mode) even when the battery is very low. Card emulation transactions when battery is low are not limited to 24 hours. With certain telecommunications systems, NFC transactions are possible with battery voltage as low as about 2 Volts, whereas platform cutoff voltage is much higher than 2 Volts in such systems. In general, NFC transactions are made possible with battery voltage lower than the platform cutoff voltage. Very little software is needed to configure the chipset before the OFF mode is triggered (i.e. before the first connection is configured in high impedance mode). In addition, this method does not require an external module which would increase complexity and possibly lead to certification issues on the subscriber identity module. This method is also advantageous in that it enables better control by the chipset (as opposed to situations in which an external component is controlled by the NFC module).

Another aspect of the invention relates to a computer program product comprising one or more stored sequences of instructions that are accessible to a processor and which, when executed by the processor, cause the processor to carry out the steps of a method according to an aspect of the invention.

Another aspect of the invention relates to a non-transitory computer readable storage medium storing a computer program according to an aspect of the invention.

Another aspect of the invention relates to a telecommunications system. The telecommunications system comprises a chipset, an NFC circuit, and a set of contacts arranged to connect the telecommunications system to a subscriber identity module.

The telecommunications system comprises a first connection between the chipset and a power supply contact and a second connection between the NFC circuit and the power supply contact.

The system is arranged to measure a level of charge of a battery powering the system with a battery gauge.

The system is arranged, when the measured level is higher than a threshold, to power a subscriber identity module through the first connection, and, upon detection of an NFC device by the NFC circuit, to establish a connection between the subscriber identity module and the NFC device through the NFC circuit and a communications contact of the telecommunications system.

The system is arranged, when the battery gauge measures a level of charge lower than or equal to the threshold, to apply a pull down, from the chipset, on the first connection, to configure the first connection, from the chipset, in high impedance mode, and, upon detection of an NFC device by the NFC circuit, to power the subscriber identity module from the NFC circuit through the second connection, and to establish a connection between the subscriber identity module and the NFC device through the NFC circuit and said communications contact.

DRAWINGS

Embodiments of the present invention are illustrated by way of example, and not by way of limitation, in the figures of the accompanying drawings, in which like reference numerals refer to similar elements and in which.

DESCRIPTION

Figure 1:
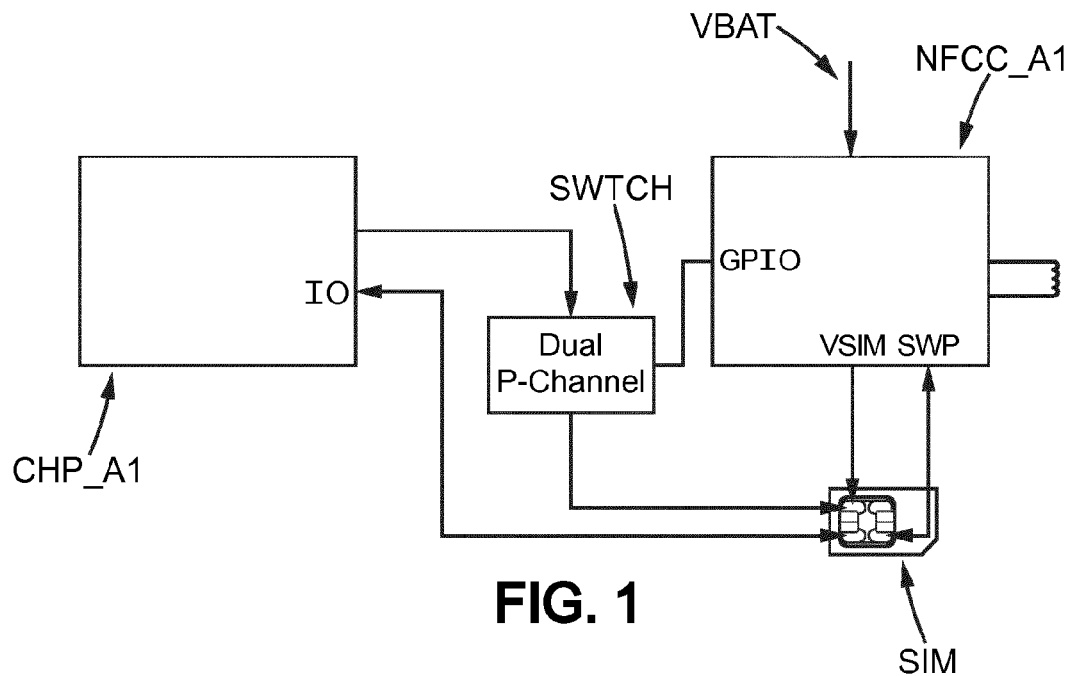
FIG. 1 represents a first cell phone architecture for maximizing NFC support by a cell phone when the battery of the cell phone is low.

Referring to FIG. 1, there is shown therein a schematic view of a first cell phone architecture for maximizing NFC support by a cell phone when the battery of the cell phone is low. A cellular phone comprises a chipset CHP_A1 and an NFC circuit NFCC_A1 comprising an NFC antenna. The NFC circuit is powered by a battery (it receives a voltage VBAT) however it can be powered by an NFC reader as well. The same battery can power the chipset CHP_A1.

The chipset comprises an input output port IO connectable to a SIM card through a connection which may be a single wire (communications in half duplex using the port of the SIM card, in compliance with ISO 7816).

The chipset is also set to power the SIM card through a switch SWTCH (which is an external component referred to as "Dual P-Channel". When the battery charge level is sufficient, the switch is closed (i.e. shorted, thereby letting the current flow) and the chipset powers the SIM card. When the charge level of the battery is too low for the chipset to supply the SIM card, and when the NFC circuit identifies the field of an NFC device, the NFC circuit may instruct the switch to open thanks to a general purpose input output port GPIO. It can then supply power to the SIM through the VSIM contact, and establish a connection through the SWP contact.

Figure 2:
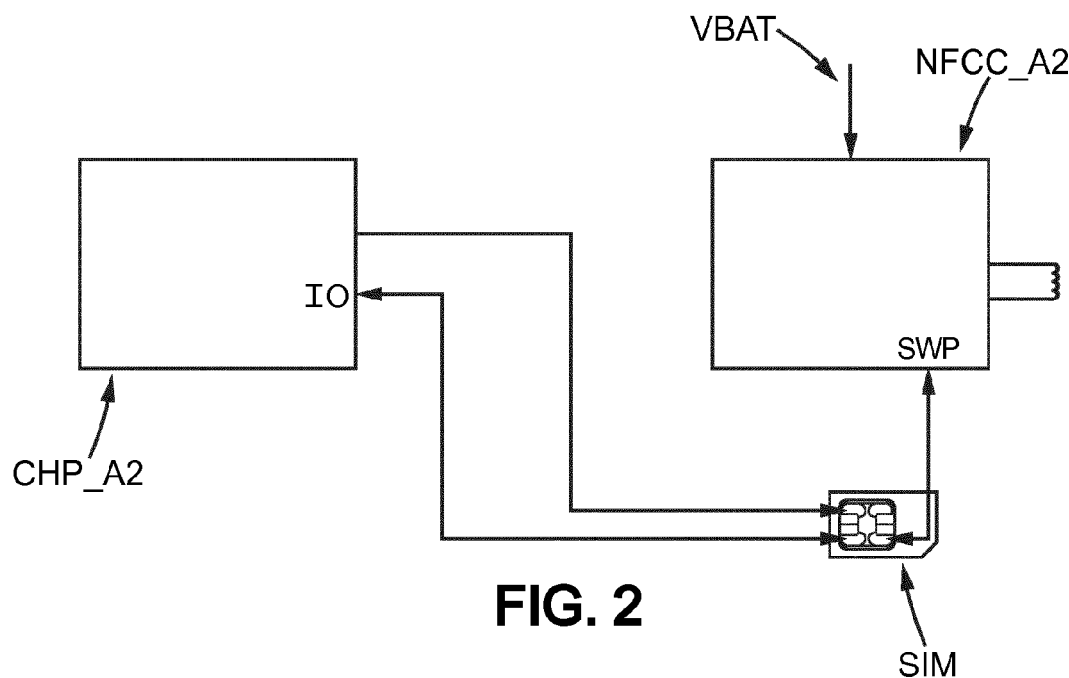
FIG. 2 represents a second cell phone architecture for maximizing NFC support by a cell phone when the battery of the cell phone is low.

Referring to FIG. 2, there is shown therein a schematic view of a second cell phone architecture for maximizing NFC support by a cell phone when the battery of the cell phone is low. A cellular phone comprises a chipset CHP_A2 and an NFC circuit NFCC A2 comprising an NFC antenna. The NFC circuit is powered by a battery (it receives a voltage VBAT) however it can be powered by an NFC reader as well. The same battery can power the chipset CHP_A2.

The chipset comprises an input output port IO connectable to a SIM card through a connection which may be a single wire (communications in half duplex using the port of the SIM card, in compliance with ISO 7816).

The chipset is also set to power the SIM card, even when the battery is low. When the battery is too low, the chipset enters a fake power off mode in which it no longer provides user services, except in particular powering the SIM card.

Figure 3:
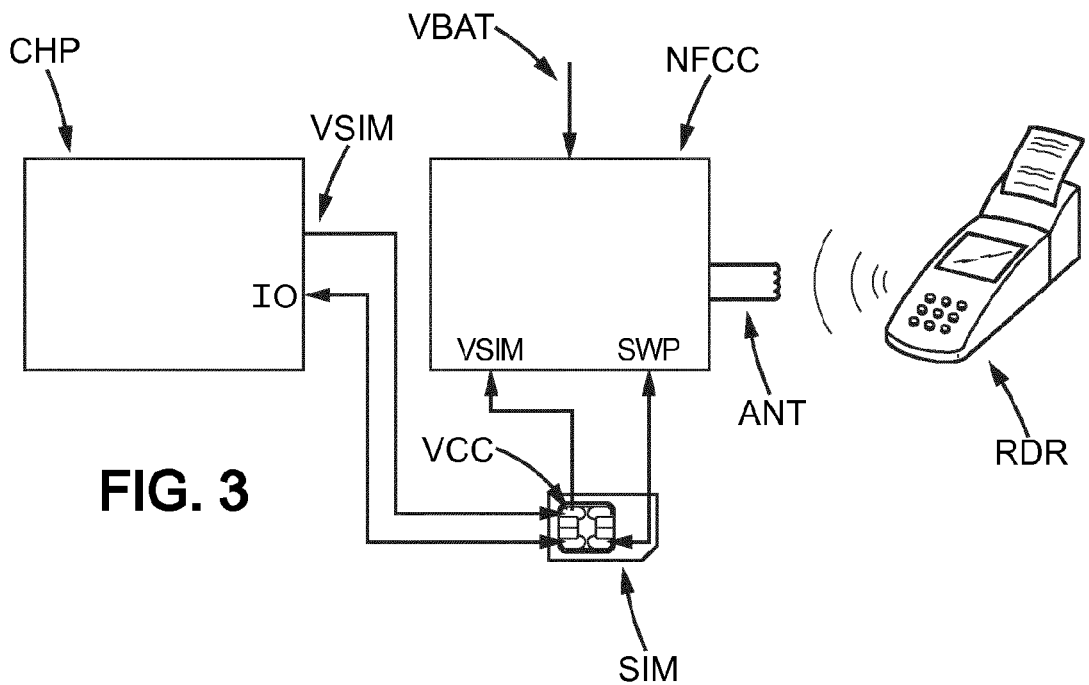
FIG. 3 represents the architecture of a telecommunications system according to a possible embodiment of the invention, the system being switched on and having a battery which charge level is sufficient.

Referring to FIG. 3, there is shown therein a schematic view of a telecommunications system architecture according to a possible embodiment, the system being in ON state (i.e. the system is powered by a battery which level of charge is sufficient, and the system has been switched on). The system comprises a chipset CHP and an NFC circuit NFCC comprising an NFC antenna ANT. The NFC circuit is powered by a battery (it receives a voltage VBAT) however it can be powered by an NFC reader RDR (such as a POS terminal with NFC capabilities) as well. The same battery can power the chipset CHP. VBAT can also be used by the NFC circuit to evaluate the level of charge of the battery.

The chipset comprises an input output port IO connectable to a SIM card through a connection which may be a single wire (communications in half duplex using the port of the SIM card, in compliance with ISO 7816).

The chipset is also set to power the SIM card through a contact VSIM/VCC (as long as the charge level of the battery is sufficient).

Although a line schematically represents the connection between the contact VSIM of the chipset and the contact VCC of the SIM card, in practice the two contacts may be in direct contact one with the other (e.g. contact of the SIM card in direct contact with a corresponding contact of the slot in which the SIM card is inserted).

According to a possible embodiment, if, for any reason, the SIM card is not powered by the chipset while the battery is sufficiently charged, the chipset automatically maintains the VSIM contact in pull down mode. Reasons for not powering the SIM card could include, for example, the fact that the system might be starting. The software of many telecommunications systems is so complex that many seconds may be needed (sometimes 30 seconds or even more) to fully start the system after having pressed an ON button. During this boot time, it might be that the SIM card is not yet powered, in which case the VSIM contact is pulled down. Other reasons for not powering the SIM card while the system is ON and the battery is sufficiently charged may include, for example, certain "flight modes". "Flight modes" are options offered by certain systems to disable cellular networking (and/or other forms of wireless network connectivity). This enables the use of non-wireless features of a system when traveling in an aircraft (regulations typically prohibit the use of cell phones in flying aircrafts, but "flight modes" may lift the prohibition). Certain flight modes comprise switching off the SIM card.

Figure 4:
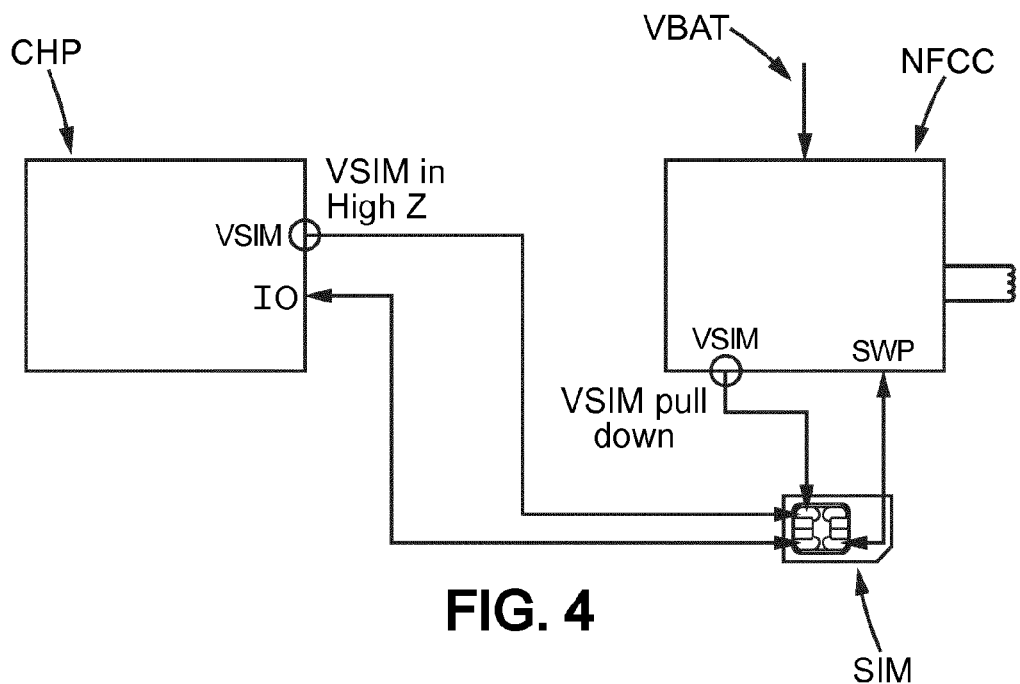
FIG. 4 represents the architecture of FIG. 3 after switch off.

According to a possible embodiment, switching off the system depicted on FIG. 3, or running out of battery on such a system, triggers a number of actions, and results in the system being configured as depicted on FIG. 4. First of all, the chipset ceases injecting power on contact VSIM normally supplying the SIM card (power is switched off, and any task executed by the SIM card may be interrupted). Then the VSIM contact on the chipset side is pulled down (e.g. by the chipset). The NFC circuit is configured to maintain its own VSIM contact in pull down. Then the VSIM contact on chipset side is configured in high impedance mode (this is done after having pulled down this VSIM contact on chipset side). Then the whole chipset may be switched off. The chipset typically consumes a lot of power (more than the NFC circuit). The high impedance configuration may be controlled by registers in the chipset. The registers may be maintained when the chipset is off (even if the battery is completely removed), for example using EEPROM type technology. This is advantageous as VSIM remains in high impedance if so configured by the chipset before the chipset is switched off.

Figure 5:
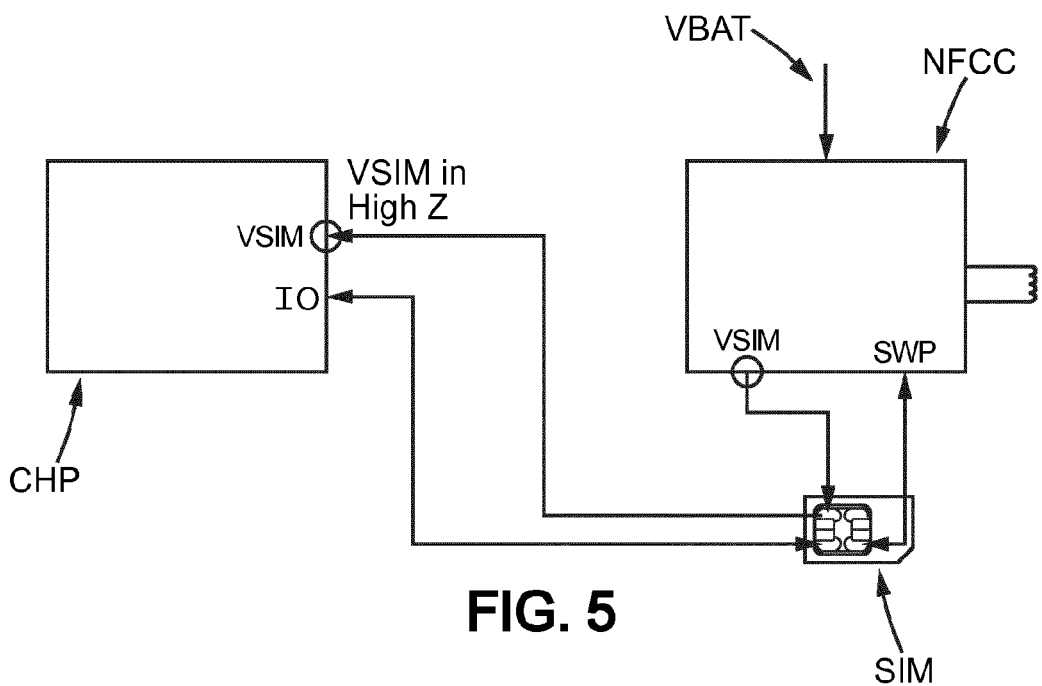
FIG. 5 represents the architecture of FIG. 4 after it has entered an NFC field.

FIG. 5 depicts a system as shown on FIG. 4 after such system has entered an NFC field (in order to communicate with an NFC device, e.g. for micropayment or ticketing transaction). When entering an NFC field, an interrupt may be triggered in the NFC circuit. The NFC circuit receives power from the battery (voltage VBAT) and from the NFC device. The NFC may then supply power to the SIM card through its VSIM contact, allowing the desired transaction to be performed through the SWP interface between the SIM card and the NFC circuit. The chipset, and in particular the PMU of the chipset, is protected from current leaks by the fact that the VSIM contact of the chipset is configured in high impedance.

Once the transaction finished, the VSIM contact of the NFC circuit may be switched off (by the NFC circuit) and pulled down (by the NFC circuit).

Figure 6:
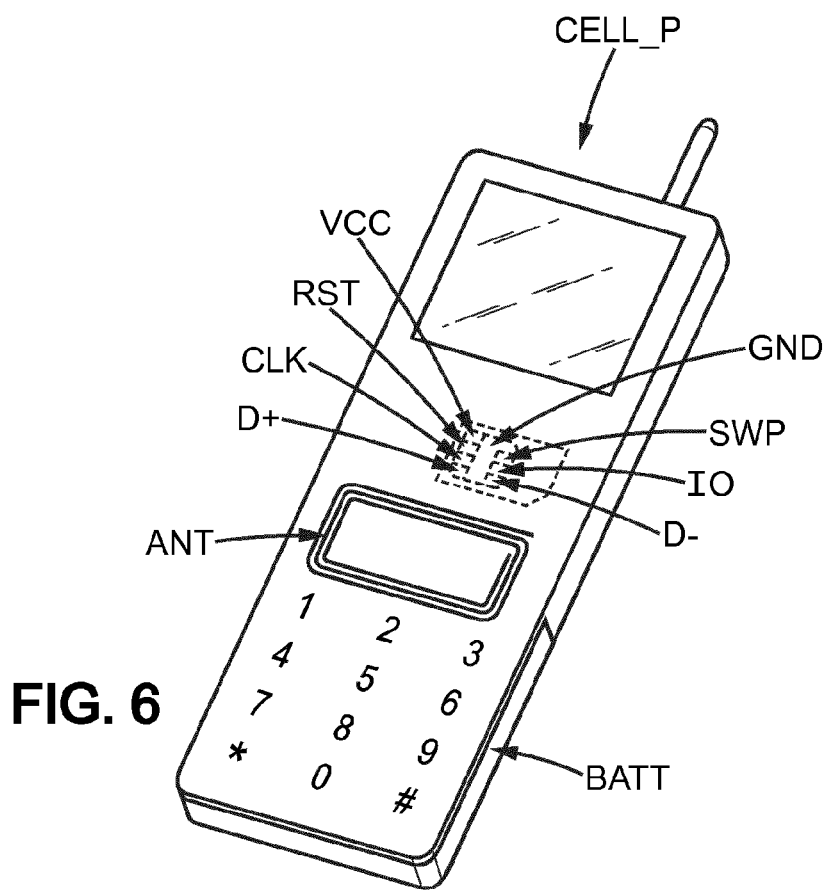
FIG. 6 represents the a telecommunications system according to a possible embodiment.

FIG. 6 shows a telecommunications system (more specifically a cellular phone CELL_P) according to a possible embodiment. The cell phone CELL_P has a battery BATT. It contains a SIM card having eight ISO 7816 contacts (VCC, RST, CLK, D+, GND, SWP, IO and D−). The cell phone comprises an antenna ANT for NFC communications.

Figure 7:
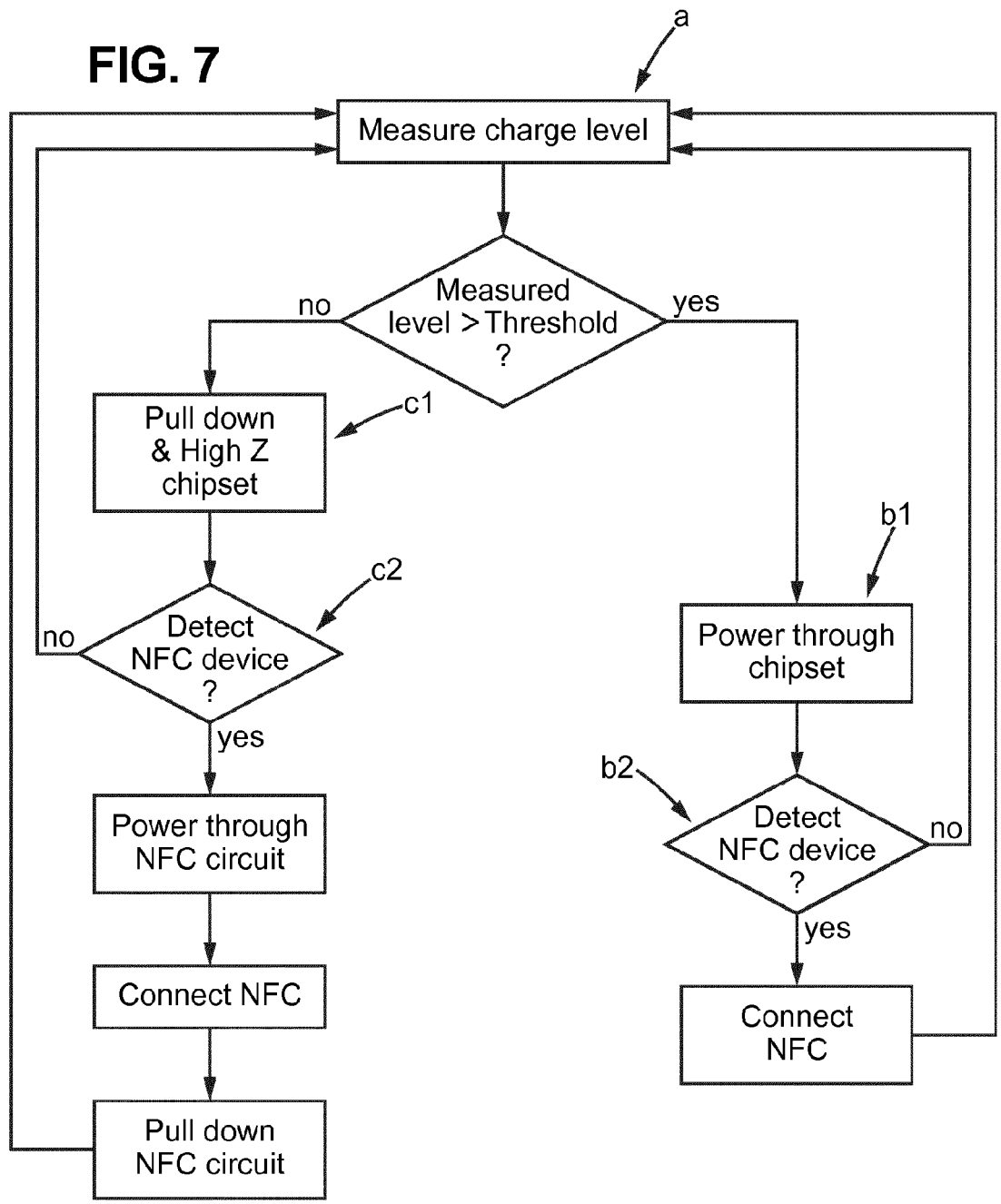
FIG. 7 is a flow chart representing a method according to a possible embodiment.

FIG. 7 is a flow chart representing a method according to a possible embodiment. In a step /a/, the method measures the charge level of a battery of a cell phone. It then tests whether the charge level is above a threshold considered sufficient to power the cell phone in the short term.

If the level is sufficiently high, in a step /b1/, the method decides to power a SIM card of the cell phone using a chipset of the cell phone (thanks to the battery). If the cell phone was already configured to power the SIM card using the chipset, step /b1/ does not need to do anything more than testing that the power configuration was already correct. In a step /b2/, the method checks whether an NFC device is in the neighborhood thanks to an NFC circuit of the cell phone. If an NFC device is detected, the SIM card continues to be powered by the chipset, and an NFC transaction takes place. In some instances the NFC transaction may be an empty transaction, e.g. in case the NFC device is not compatible or in case the SIM card is not authorized to carry out a transaction with this NFC device. Then, the method returns to step /a/.

If the level is too low, then in a step /c1/ the chipset pulls down the power connection from the chipset to the SIM card (after having stopped powering the SIM card if needed) and configures the connection in high impedance. If the connection was already configured in high impedance, step /c1/ does not need to do anything more than testing that the power configuration was already correct. In a step /c2/, the method checks whether an NFC device is in the neighborhood. If an NFC device is detected, the NFC circuit powers the SIM card, and an NFC transaction takes place. In some instances the NFC transaction may be an empty transaction (as explained previously). Then the NFC circuit pulls down its power connection with the SIM card. The method returns to step /a/.

According to a possible embodiment, a method is proposed for establishing an NFC connection between a subscriber identity module SIM and an NFC device RDR (for example an NFC reader adapted to communicate with NFC smart cards). This connection can be used to carry out an NFC transaction (such as opening a gate to access public transportation or buying something with a micro-payment). The subscriber identity module is a hardware device identifying a subscriber (e.g. a client of a bank, a client of a public transportation company, a client of a cellular network operator, etc.). The subscriber identity module is typically issued by the company (bank, network operator, etc.) offering the services to which the user has subscribed, and may remain owned by such company (although it typically remains under the custody of the user). The subscriber identity module may be a SIM card (and any variant of the SIM card, such as UICCs, USIMs, CSIMs, etc., collectively referred to as SIM cards), but may also be any secure element used by any third party (banks providing secure MMC cards for cell phones, etc.). The subscriber identity module is connected to a telecommunications system CELL_P (such as a cell phone, a smart phone, a tablet, or any electronic device usable to connect to a network) through contacts. The contacts can be, in case the subscriber identity module is a SIM card, eight contacts corresponding to the smart card contacts specified by ISO-7816. Such contacts are: VCC (for the power supply), RST (for resetting the card), CLK (for injecting a clock signal), D+ (USB data contact), GND (ground), SWP (Single Wire Protocol), IO (input output) and D− (other USB data contact). The above names of the contacts are names which are typically given for SIM cards. The corresponding names in the telecommunications system may be different. For example the power supply contact of the telecommunications system for powering the SIM card is often called VSIM (but is typically directly connected to the VCC contact of the SIM). The names are used interchangeably (VCC and VSIM are considered synonymous), although strictly speaking VSIM designates the part which belongs to the telecommunications device and VCC the part that belongs to the SIM card. The contacts can be the contacts of a slot of the telecommunications system in which a SIM card may be inserted. A spring pushing the SIM card towards the slot, or any other known mechanical device, may establish electrical contact between the respective contacts of the SIM card and contacts of the telecommunications device. Alternatively, a SIM card chip (or any other appropriate chip) may be soldered to the contacts of the telecommunications device (e.g. the eight contacts according to ISO 7816). The telecommunications system may comprise several slots (or many SIM card chips or other chips may be soldered, e.g. to a motherboard of the telecommunications system). For example, the telecommunications system may be a dual SIM cell phone containing simultaneously a personal and a professional SIM card, or a CDMA compliant card and a card compliant with another type of network. The telecommunications system comprises a chipset CHP and an NFC circuit NFCC. The chipset may contain a digital baseband, an analog base band and a PMU (power management unit) for powering the subscriber identity module. The PMU may be embedded in the analog base band. The chipset may contain a modem and an APE (application engine), as well as an operating system.

The method comprises measuring the level of charge of a battery BATT powering the telecommunications system CELL_P with a battery gauge. The measuring may be carried out repeatedly, e.g. every second. The measuring may be carried out by the telecommunications system, in particular by the chipset.

The method may then comprise comparing (e.g. with a voltage comparator) the measured level of charge with a reference. The reference can be a threshold representing a very low level of charge, below which there is no guarantee that the battery will be able to supply enough power to the subscriber identity module for NFC transactions.

If the measured level is greater than the threshold, the method comprises powering the subscriber identity module through a first connection between a power supply contact VCC (or several power supply contacts) of the telecommunications system CELL_P and the chipset CHP. Such power supply contact(s) may be a subset (such as the ISO 7816 VCC contact) of the above referred contacts (such as the eight ISO 7816 contacts). In a possible embodiment, there is only one power supply contact (the contact VCC according to ISO 7816).

The method further comprises, upon detection of an NFC device by the NFC circuit, establishing a connection between the subscriber identity module and the NFC device through the NFC circuit and a communications contact (or several communications contacts) of the telecommunications system. Such communications contact(s) may be a subset (such as the ISO 7816 SWP contact) of the above referred contacts (such as the eight ISO 7816 contacts). In a possible embodiment, there is only one communications contact (the contact SWP according to ISO 7816). The SWP protocol is specified in particular in ETSI standard TS 102.613. Power supplied to the subscriber identity module is still supplied through the first connection, i.e. by the chipset (until the level of charge changes in a specified manner).

Detecting NFC devices by the NFC circuit may be achieved by monitoring NFC fields by the NFC circuit.

If the measured level is lower than or equal to the threshold, the method comprises (after having switched off, if applicable, the power supply from the chipset to the subscriber identity module through the first connection) applying a pull down on the first connection from the chipset and then configuring the first connection, from the chipset, in high impedance mode. One way to apply a pull-down is to use a pull-down resistor connected to ground, which holds the logic signal near zero volts when no other active device is connected. The first connection is said to be in high impedance when its impedance is made much higher (e.g. more than ten times higher) than the impedance of the second connection discussed below.

According to a possible embodiment, this pull down and configuration in high impedance mode is achieved fully by hardware components. For example, a voltage comparator can detect that the threshold has been reached (battery too low), and output a logic level 1, which may be fed into a pull down circuit and into a high impedance configuration circuit, thereby activating pull down and high impedance configuration. Hardware pull down and high impedance mode configuration is advantageous in that it is typically faster than software and more reliable (no bugs, no influence from other software running concurrently, etc.). Accordingly, if the batter load becomes too low, it is likely that the first connection can be put in high impedance mode very quickly (before battery is completely empty). This may be very advantageous in particular when, during a phone call with a telecommunication system, data bursts may lead to current spikes, and generate emergency shut down at any time (the system shuts down in order to preserve integrity.

According to another embodiment, the first connection is pulled down and configured in high impedance mode using software (hardware circuits may be triggered by a piece of software). This is advantageous in that it is typically easier to implement and maintain (which is a fundamental constraint in many developments), but may be slower and possibly less reliable. For example, reaching the threshold may trigger a hardware interrupt instructing a processor associated with an interrupt management software to order the pull down and the high impedance configuration, e.g. using special registers of the microcontroller. For example, writing a bit one into a determined register of the microcontroller may activate a pull down circuit (and same for the high impedance circuit). There can also be a single circuit for both pull down and high impedance management (this applies to other embodiments as well). Such circuit may receive a single order to pull down and configure high impedance, or receive (for example consecutively) a first order to pull down and a second order to configure the first connection in high impedance.

Alternatively, a piece of software may implement a polling loop, whereby a microcontroller is instructed to use one of its ADCs (analog to digital converters) to measure the level of charge of the battery at regular intervals. For example, in a multitask environment, the loop may run in background and use a waiting loop, or read a timer register, to determine when to measure the level of charge again. When the measured level drops too low, the software may trigger the pull down and high impedance configuration.

Upon detection of an NFC device RDR (such as an NFC POS at a bakery) by the NFC circuit NFCC (e.g. by monitoring NFC fields by the NFC circuit), the method comprises powering the subscriber identity module from the NFC circuit through a second connection between said power supply contact VCC (or contacts, as the case may be) and the NFC circuit, and establishing a connection between the subscriber identity module and the NFC device through the NFC circuit and said communications contact.

The threshold may be, for example, a value representing a certain load of the battery, in the form of a floating point number. It may also be an integer. For example, an integer value of 20 may represent a fully loaded battery, while a value of 0 may represent an empty battery. The threshold may be a low value (very close to an empty battery). For example, if the load of the battery is represented by an integer between 0 and 20, the threshold could be equal to 2, i.e. all loads from 3 to 20 could lead to the subscriber identity module being supplied by the chipset (e.g. by the battery, through the chipset), while for all loads between 0 and 2 the SIMs could have to be supplied by the NFC circuit (thanks to the field generated by the NFC reader).

If by accident the telecommunications system is communicating via the NFC circuit at the time the measured level drops down to or below the threshold, then it is possible to interrupt the current NFC transaction and to force the telecommunications system to restart the NFC transaction after power supply is switched from chipset/battery to NFC circuit. NFC transactions are typically very fast (i.e. the problem is unlikely to occur, and if it does, the user would simply have to tap his telecommunications device again to the NFC reader). Given that NFC transactions are typically split in atomic sub parts such that any started transaction that is not completed can be rolled back to the last coherent status, an interrupted NFC transaction can normally be gracefully closed (in the middle) and optionally restarted at a later stage. This avoids creating an inconsistent status in which, for example, money has left the telecommunications device (a money register having been decremented in the SIM card), without having reached the NFC reader of the POS (a money register of the POS not having been incremented yet) at the time the NFC transaction is interrupted.

A method according to a possible embodiment comprises applying a pull down on the second connection from the NFC circuit. The NFC circuit may comprise logic (for example hardwired logic, or a properly programmed processor, or dedicated electronics) for carrying out this and other tasks without involving the chipset. One way to apply a pull-down is to use a pull-down resistor connected to ground, which holds the logic signal near zero volts when no other active device is connected.

The pull down can be maintained until two conditions are simultaneously met. A first condition is the chipset having configured the first connection in high impedance mode (after having, if necessary, shutdown the power supply through the first connection and pulled down the first connection). A second condition is the NFC circuit having detected an NFC device. At that stage (the two conditions being met), the method can start supplying power to the subscriber identity module from the NFC circuit through the second connection.

A method according to a possible embodiment comprises detecting a shutdown of the system (which battery charge level is above the threshold). Such shutdown may be due, for example, to the user pressing an OFF button of the system in order to save battery capacity for the future, or to avoid being disturbed during a meeting or when watching a movie. The shutdown may also be triggered by a software (e.g. shutdown may be necessary in order to update an operating system or simply an application). When shutdown is requested by any entity, an interruption may be triggered (notifying interested modules of this fact).

Since the battery is not low, it would be possible for the user to switch the system on again in order to perform an NFC transaction. However, certain systems are very long to power up. In addition, after having been switched off for a long time (or under tough conditions such as low temperatures), the battery may become discharged, in which case it is no longer possible to power up the system, even if one is ready to wait. In order to avoid such inconveniences, the method comprises, upon detection of a shutdown (and before the shutdown is actually carried out) applying a pull down on the first connection from the chipset and then configuring the first connection, from the chipset, in high impedance mode. This task of applying the pull down and high impedance configuration may be carried out by hardware in order to make sure that it is fast enough (it should be completed before the shutdown actually takes place). After shutdown, the chipset is typically no longer available (not powered). The method subsequently comprises, upon detection of an NFC device by the NFC circuit (which may be powered by the battery and/or by the NFC device), powering the subscriber identity module from the NFC circuit through the second connection, and establishing a connection between the subscriber identity module and the NFC device through the NFC circuit and said communications contact.

A method according to a possible embodiment comprises defining the threshold by reading a default threshold value from a memory of the telecommunications system. For example, the threshold value can be read from a non-volatile memory (such as EEPROM, ROM or Flash) controlled by an operating system of the telecommunications system (e.g. a module of the chipset). The threshold value can be read by the chipset.

For example, any cellular phone of a given brand and model may use the same threshold value, which may be pre-programmed when the cellular phone is manufactured.

A method according to a possible embodiment comprises defining the threshold by reading (e.g. by the chipset) a default threshold value from a memory of the battery.

According to this variant, the value of the threshold is supplied by the battery, which may or may not be under the control of the telecommunications system provider. It is possible, for example, that a given telecommunications system may be powered by various batteries, each having different properties (e.g. thick and heavy with a good autonomy, or slim and light with bad autonomy). In such case, it may be appropriate to query the battery, which may have stored a more relevant value than what may be stored in the telecommunications system.

A method according to a possible embodiment comprises defining the threshold by reading (e.g. by the chipset, or more generally by the telecommunications system), from the battery BATT, a battery identifier, and determining the threshold on the basis of the battery identifier. The definition of the threshold may also depend, for example, on a type of telecommunications system. A telecommunications system which is known to require a lot of power may cause the threshold to be reduced compared to another telecommunications system. Other parameters may be taken into account when defining the threshold. For example, SIM cards can be powered in 5V, 3V or 1.8V and may have varying degrees of power consumption. The voltage used to power a SIM card can be negotiated after power up of the SIM card thanks to parameters in the ATR, depending on the capabilities of the telecommunications system.

A computer program product according to a possible embodiment comprises one or more stored sequences of instructions that are accessible to a processor and which, when executed by the processor, cause the processor to carry out the steps of a method according to a possible embodiment. The instructions may be written in a language such as C, C++, C#, Java, assembly languages, etc. The processor may be a processor embedded in the telecommunications system, or more specifically in the chipset.

Computer program means any expression, in any language, code or notation, of a set of instructions intended to cause a system having an information processing capability to perform a particular function either directly or after conversion to another language. Such a computer program can be stored on a computer or machine readable medium allowing data, instructions, messages or message packets, and other machine readable information to be read from the medium. The computer or machine readable medium may include non-volatile memory, such as ROM, Flash memory, Disk drive memory, CD-ROM, and other permanent storage. Additionally, a computer or machine readable medium may include, for example, volatile storage such as RAM, buffers, cache memory, and network circuits. Furthermore, the computer or machine readable medium may comprise computer or machine readable information in a transitory state medium such as a network link and/or a network interface, including a wired network or a wireless network, that allow a device to read such computer or machine readable information.

A non-transitory computer readable storage medium according to a possible embodiment comprises a computer program according to a possible embodiment. The storage medium may be a memory (such as EEPROM, Flash, ROM, etc.), which may be removable (e.g. SD card, microSD card, etc.) or be soldered or otherwise attached to the telecommunications system.

A telecommunications system CELL_P according to a possible embodiment comprises a chipset CHP, an NFC circuit NFCC, and a set of contacts (VCC, RST, CLK, D+, GND, SWP, IO, D−) arranged to connect the telecommunications system CELL_P to a subscriber identity module SIM. The subscriber identity module may or may not form an integral part of the telecommunications system. The subscriber identity module may in particular be a removable module insertable in a slot of the telecommunications system. Accordingly, the telecommunications system may be potentially attached to a multitude of subscriber identity modules (e.g. a telecommunications system may be used by different persons, each inserting his/her own SIM card when willing to use the system). The telecommunications system further comprises a first connection between the chipset CHP and a power supply contact VCC (this power supply contact VCC may be a contact of the set of contacts of the telecommunications system), a second connection between the NFC circuit NFCC and the power supply contact VCC.

The system is arranged (provided a battery BATT is inserted in or otherwise connected to the system) to measure a level of charge of the battery BATT powering the system with a battery gauge. The battery may or may not form an integral part of the telecommunications system. Similarly, the battery gauge arranged to measure the level of charge of a battery may or may not form an integral part of the telecommunications system. More specifically, the battery gauge may be embedded in the battery itself, and the battery may be removable from the system, from which it may be distinct. But the battery gauge may also be embedded in the telecommunications system. The gauge may for example provide information similar to the bars conventionally displayed on the screen of most cell phone. For example an integer equal to 5 may indicate a fully charged battery, a integer equal to 1 may indicate that only one bar remains (this may be the threshold), and an integer equal to 0 would correspond to an empty battery. Alternatively, the threshold may correspond to a more accurate measurement (corresponding to a charge level located somewhere between zero bar and one bar).

The system is arranged, when the measured level is higher (strictly higher) than a threshold, to power a subscriber identity module SIM through the first connection, and, upon detection of an NFC device RDR by the NFC circuit NFCC, to establish a connection between the subscriber identity module SIM and the NFC device through the NFC circuit and a communications contact SWP of the telecommunications system.

The system is arranged, when the battery gauge measures a level of charge lower than or equal to the threshold, to apply a pull down, from the chipset CHP, on the first connection, to configure the first connection, from the chipset CHP, in high impedance mode, and, upon detection of an NFC device RDR by the NFC circuit NFCC, to power the subscriber identity module from the NFC circuit through the second connection, and to establish a connection between the subscriber identity module SIM and the NFC device through the NFC circuit and said communications contact SWP.

A telecommunications system according to a possible embodiment is arranged to apply a pull down on the second connection from the NFC circuit until the chipset has configured the first connection in high impedance mode and the NFC circuit has detected an NFC device. Accordingly, the system may enforce a permanent pull down on the second connection until a tentative NFC connection takes place while the first connection is in high impedance. As soon as the NFC transaction is finished, the NFC circuit may pull down the second connection again.

According to a possible embodiment, the system is arranged, upon detection of a shutdown of the system which battery charge level is above the threshold, to apply a pull down on the first connection from the chipset and then configuring the first connection, from the chipset, in high impedance mode, and, upon detection of an NFC device by the NFC circuit, to power the subscriber identity module from the NFC circuit through the second connection, and to establish a connection between the subscriber identity module and the NFC device through the NFC circuit and said communications contact.

According to a possible embodiment, the system is arranged to define the threshold by reading a default threshold value from a memory of the telecommunications system. For example, each type of cell phone may store this kind of information in a dedicated memory.

According to a possible embodiment, the system is arranged to define the threshold by reading a default threshold value from a memory of the battery BATT.

According to a possible embodiment, the system is arranged to define the threshold by reading, from the battery BATT, a battery identifier, and determining the threshold on the basis of the battery identifier (and possibly also on the basis of the type of telecommunications system).

The variants described with respect to the method for establishing an NFC connection apply to the telecommunications system, and vice versa. While the description focused primarily on telecommunications systems of the cell phone type, many other telecommunications systems may benefit from the invention. For example, more and more equipments embed a SIM card for M2M (machine to machine) or other purposes. For example, emergency call booth on highways may have SIM cards, and are sometimes powered by solar panels, i.e. they could potentially run out of battery. In such case, they could still, thanks to the invention, offer basic NFC support providing drivers whose cellular phone supports NFC and has a properly charged battery with various information such as their exact location, various phone numbers and addresses, etc.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

A person skilled in the art will readily appreciate that various parameters disclosed in the description may be modified and that various embodiments disclosed and/or claimed may be combined without departing from the scope of the invention.

It is stipulated that the reference signs in the claims do not limit the scope of the claims, but are merely inserted to enhance the legibility of the claims.

The invention claimed is:

1. A method for establishing an NFC connection between a subscriber identity module and an NFC device, the subscriber identity module being connected to a telecommunications system through contacts of the telecommunications system, the telecommunications system comprising a chipset and an NFC circuit, the method comprising:
   /a/ measuring the level of charge of a battery powering the telecommunications system with a battery gauge,
   /b/ if the measured level is greater than a threshold,
      /b1/ powering the subscriber identity module through a first connection between a power supply contact of the telecommunications system and the chipset,
      /b2/ upon detection of an NFC device by the NFC circuit, establishing a connection between the subscriber identity module and the NFC device through the NFC circuit and a communications contact of the telecommunications system,
   /c/ if the measured level is lower than or equal to the threshold,
      /c1/ applying a pull down on the first connection from the chipset and then configuring the first connection, from the chipset, in high impedance mode,
      /c2/ upon detection of an NFC device by the NFC circuit, powering the subscriber identity module from the NFC circuit through a second connection between said power supply contact and the NFC circuit, and establishing a connection between the subscriber identity module and the NFC device through the NFC circuit and said communications contact.

2. The method according to claim 1, further comprising applying a pull down on the second connection from the NFC circuit until the chipset has configured the first connection in high impedance mode and the NFC circuit has detected an NFC device.

3. The method according to claim 1, further comprising, upon detection of a shutdown of the system when the battery charge level is above the threshold:

/d1/ applying a pull down on the first connection from the chipset and then configuring the first connection, from the chipset, in high impedance mode, /d2/ upon detection of an NFC device by the NFC circuit, powering the subscriber identity module from the NFC circuit through the second connection, and establishing a connection between the subscriber identity module and the NFC device through the NFC circuit and said communications contact.

4. The method according to claim 1, comprising defining the threshold by reading a default threshold value from a memory of the telecommunications system.

5. The method according to claim 1, comprising defining the threshold by reading a default threshold value from a memory of the battery.

6. The method according to claim 1, comprising defining the threshold by reading, from the battery, a battery identifier, and determining the threshold on the basis of the battery identifier.

7. A telecommunications system comprising:
a chipset,
an NFC circuit,
a set of contacts arranged to connect the telecommunications system to a subscriber identity module,
a first connection between the chipset and a power supply contact,
a second connection between the NFC circuit and said power supply contact,
the system being arranged to measure a level of charge of a battery powering the system with a battery gauge,
the system being arranged, when the measured level is higher than a threshold, to power a subscriber identity module through the first connection, and, upon detection of an NFC device by the NFC circuit, to establish a connection between the subscriber identity module and the NFC device through the NFC circuit and a communications contact of the telecommunications system,
the system being arranged, when the battery gauge measures a level of charge lower than or equal to the threshold, to apply a pull down, from the chipset, on the first connection, to configure the first connection, from the chipset, in high impedance mode, and, upon detection of an NFC device by the NFC circuit, to power the subscriber identity module from the NFC circuit through the second connection, and to establish a connection between the subscriber identity module and the NFC device through the NFC circuit and said communications contact.

8. The system according to claim 7, wherein the system is arranged to apply a pull down on the second connection from the NFC circuit until the chipset has configured the first connection in high impedance mode and the NFC circuit has detected an NFC device.

9. The system according to claim 7, wherein the system is arranged, upon detection of a shutdown of the system when the battery charge level is above the threshold, to apply a pull down on the first connection from the chipset and then configuring the first connection, from the chipset, in high impedance mode, and, upon detection of an NFC device by the NFC circuit, to power the subscriber identity module from the NFC circuit through the second connection, and to establish a connection between the subscriber identity module and the NFC device through the NFC circuit and said communications contact.

10. The system according to claim 7, wherein the system is arranged to define the threshold by reading a default threshold value from a memory of the telecommunications system.

11. The system according to claim 7, wherein the system is arranged to define the threshold by reading a default threshold value from a memory of the battery.

12. The system according to claim 7, wherein the system is arranged to define the threshold by reading, from the battery, a battery identifier, and determining the threshold on the basis of the battery identifier.

13. A non-transitory computer storage medium encoded with a computer program, the program comprising instructions that when executed by data processing apparatus cause the data processing apparatus to establish:
an NFC connection between a subscriber identity module and an NFC device, the subscriber identity module being connected to a telecommunications system through contacts of the telecommunications system, the telecommunications system comprising a chipset and an NFC circuit, by performing operations including:
measuring, with a battery gauge, a level of charge of a battery powering a telecommunications system that includes a chipset and an NFC circuit;
if the measured level is greater than a threshold:
powering a subscriber identity module through a first connection between a power supply contact of the telecommunications system and the chipset; and
upon detection of an NFC device by the NFC circuit, establishing a connection between the subscriber identity module and the NFC device through the NFC circuit and a communications contact of the telecommunications system;
if the measured level is lower than or equal to the threshold:
applying a pull down on the first connection from the chipset and then configuring the first connection, from the chipset, in high impedance mode,
upon detection of an NFC device by the NFC circuit, powering the subscriber identity module from the NFC circuit through a second connection between the power supply contact and the NFC circuit, and establishing a connection between the subscriber identity module and the NFC device through the NFC circuit and said communications contact.

14. The non-transitory computer storage medium of claim 13, wherein the program further comprises instructions that when executed by data processing apparatus cause the data processing apparatus to perform operations including applying a pull down on the second connection from the NFC circuit until the chipset has configured the first connection in high impedance mode and the NFC circuit has detected an NFC device.

15. The non-transitory computer storage medium of claim 13, wherein the program further comprises instructions that when executed by data processing apparatus cause the data processing apparatus to perform operations including, upon detection of a shutdown of the system when the battery charge level is above the threshold:
applying a pull down on the first connection from the chipset and then configuring the first connection, from the chipset, in high impedance mode,
upon detection of an NFC device by the NFC circuit, powering the subscriber identity module from the NFC circuit through the second connection, and establishing a connection between the subscriber identity module and the NFC device through the NFC circuit and said communications contact.

16. The non-transitory computer storage medium of claim 13, wherein the program further comprises instructions that when executed by data processing apparatus cause the data processing apparatus to perform operations including defining the threshold by reading a default threshold value from a memory of the telecommunications system.

17. The non-transitory computer storage medium of claim 13, wherein the program further comprises instructions that when executed by data processing apparatus cause the data processing apparatus to perform operations including defining the threshold by reading a default threshold value from a memory of the battery.

18. The non-transitory computer storage medium of claim 13, wherein the program further comprises instructions that when executed by data processing apparatus cause the data processing apparatus to perform operations including defining the threshold by reading, from the battery, a battery identifier, and determining the threshold on the basis of the battery identifier.

* * * * *